United States Patent [19]

Leitch

[11] Patent Number: 4,596,043
[45] Date of Patent: Jun. 17, 1986

[54] HIGH EFFICIENCY RADIO FREQUENCY SIGNAL AMPLIFIER FOR AMPLIFYING MODULATED RADIO FREQUENCY SIGNALS IN A MANNER GENERATING MINIMAL SPLATTER

[75] Inventor: Clifford D. Leitch, North Lauderdale, Fla.

[73] Assignee: Motorola, Inc., Schaumburg, Ill.

[21] Appl. No.: 540,211

[22] Filed: Oct. 7, 1983

Related U.S. Application Data

[63] Continuation-in-part of Ser. No. 363,178, Mar. 29, 1982, abandoned.

[51] Int. Cl.$^4$ .............................................. H04B 1/04
[52] U.S. Cl. ..................................... 455/91; 455/109; 332/37 R
[58] Field of Search ..................... 455/46, 47, 91, 108, 455/109; 332/37 R, 44, 45

[56] References Cited

U.S. PATENT DOCUMENTS

| | | | |
|---|---|---|---|
| 2,705,775 | 4/1955 | Crosby | 455/109 |
| 2,784,311 | 3/1957 | Kahn . | |
| 2,900,459 | 8/1959 | Olive | 455/109 |
| 2,903,518 | 9/1959 | Kahn . | |
| 2,989,707 | 6/1961 | Kahn . | |
| 2,992,326 | 7/1961 | Kahn . | |
| 3,492,429 | 1/1970 | Schroeder | 455/47 |
| 3,566,285 | 2/1971 | Schroeder . | |
| 4,176,319 | 11/1979 | Kahn . | |

*Primary Examiner*—Jin F. Ng
*Attorney, Agent, or Firm*—Joseph T. Downey; Edward M. Roney; James W. Gillman

[57] ABSTRACT

A processing circuit for efficiently amplifying radio frequency signals while generating minimal splatter includes a first channel having an envelope detector for generating a rectified envelope signal from a modulated radio frequency input signal provided thereto. The first channel includes a peak clipping circuit which clips portions of the rectified envelope signal having an instantaneous voltage less than a first selected threshold level. A second channel includes a symmetric clipping circuit for symmetrically clipping portions of the modulated radio frequency input signal which exceed a second voltage threshold level. The second threshold level is selected such that the symmetrical clipping circuit clips signals in the second channel at times when the peak clipping circuit allows the rectified envelope signal in the first channel to remain unclipped and such that the symmetrical clipping circuit allows signals in the second channel to remain unclipped at times when the peak clipping circuit of the first channel is clipping the rectified envelope signal. A second amplifier is coupled to the symmetrical clipping circuit and the first channel output such that the first channel output signal modulates signals amplified by the second amplifier. The second amplifier is operative in a first mode for linearly amplifying the unclipped portions of the symmetrically clipped signal and is operative in a second mode for efficiently non-linearly amplifying the clipped portions of the symmetrically clipped signal. An amplified modulated radio frequency signal exhibiting minimal splatter components, is thus generated.

21 Claims, 12 Drawing Figures

HIGH EFFICIENCY RADIO FREQUENCY SIGNAL AMPLIFIER FOR AMPLIFYING MODULATED RADIO FREQUENCY SIGNALS IN A MANNER GENERATING MINIMAL SPLATTER

This application is a continuation-in-part of patent application Ser. No. 363,178 filed on Mar. 29, 1982, now abandoned.

BACKGROUND OF THE INVENTION

This invention relates to radio frequency amplifiers and more particularly to apparatus for amplifying modulated radio frequency signals in a highly efficient manner.

DESCRIPTION OF THE PRIOR ART

In radio frequency transmitters and other apparatus, circuits for amplifying relatively low amplitude modulated radio frequency signals (for example single sideband signals) up to relatively high amplitude modulated radio frequency signals are often desired. One conventional circuit for accomplishing this purpose is the class B linear amplifier. Such linear amplifiers do perform the task of amplifying single sideband signals but accomplish such amplification in an extremely inefficient manner. More specifically, the efficiency of such linear amplifiers may be as little as 20% or even less.

One conventional circuit for amplifying such signals in a more highly efficient manner is shown in FIG. 1. Unfortunately, this amplifier circuit suffers from adjacent channel interference problems and associated difficulties which will be subsequently discussed. The amplifier circuit of FIG. 1 includes an input 10 to which the low level modulated signal to be amplified is provided. For purposes of discussion, a standard two-tone single sideband test signal having modulating frequencies of two (2) kHz and four (4) kHz such as that shown in FIG. 2A is provided to input 10 such that the performance of the amplifier of FIG. 1 may be evaluated. Input 10 is connected to the input of an envelope detector 20, for example a diode, such that the envelope of the sideband input signal is extracted from the sideband signal and provided to the output of detector 20. The envelope signal thus generated appears at the output of envelope detector 20 and is fed to the input of an audio amplifier 30 which amplifies the envelope signal to a relatively high amplitude appropriate for the amplitude of the modulated high level radio frequency sideband signal which is desired to be generated. A typical envelope signal is shown in FIG. 2B.

Referring again to FIG. 1, input 10 is also connected to the input of a hard limiter 40 such that the low level modulated two-tone single sideband test signal is provided to limiter 40. Limiter 40 removes virtually all amplitude modulation from the modulated sideband signal thus generating a constant amplitude radio frequency signal containing the phase modulation of the input modulated sideband signal. A typical example of such constant amplitude radio frequency signal generated at the output of limiter 40 is shown in FIG. 2C. The output of limiter 40 is coupled to the input of a radio frequency amplifier 50 which amplifies the radio frequency signal of FIG. 2C to a level appropriate for the amplitude of the high level modulated radio frequency which is desired to be generated.

To summarize the action of the conventional circuit of FIG. 1 to this point, the audio component of the modulated sideband signal provided to input 10 is separated from the radio frequency component of such signal and provided to the output of amplifier 30 at a relatively high level. Further, the radio frequency portion of the low level sideband signal provided at input 10 is in effect separated from the audio portion thereof and is provided at a relatively high level to the output of radio frequency amplifier 50. The outputs of amplifiers 30 and 50 are coupled to respective inputs of a modulator 60 such that the high level envelope signal from audio amplifier 30 modulates the high level radio frequency signal from amplifier 60 thus resulting in generation of a high level modulated sideband signal at an output 70 of modulator 60. The signal generated at output 70 is thus an amplified version of the signal provided to input 10.

FIG. 1 is a typical amplitude vs. frequency graph for the output of the type of amplifier shown in FIG. 2D. Although the amplifier circuit of FIG. 1 is capable of amplifying modulated signals with efficiency aproaching 90%, unfortunately as seen by examining the frequency spectrum graph of FIG. 2D, such amplifier generates an extremely large amount of wideband "splatter". Splatter is known to those skilled in the art to mean radio frequency signal emissions that occur near the carrier frequency of a modulated radio frequency signal but outside of the desired bandwidth for such signal. However, signals which are harmonics of the carrier frequency are not generally considered to be splatter signals. This extremely undesirable splatter effect is intensified when transistors rather than vacuum tubes are employed to implement the circuit of FIG. 1 because feedback and neutralization techniques are less effective in limiting splatter in the FIG. 1 circuit when transistors are employed as opposed to vacuum tubes. As seen in FIG. 2D, when the aforementioned two-tone sideband test is provided to input 10 a signal is generated at output 70 which exhibits a frequency spectrum in which the wideband splatter is less than 80 dB below the output signal at output 70 (that is, occurring at a normalized frequency of 0 kHz) up to 340 KHz from the carrier frequency (designated 0 kHz). The aforementioned unfortunately extremely broad band splatter spectral components are believed to be caused by the commensurately very wide bandwidth of the limited radio frequency signal generated by limiter 40. More specifically, as seen by a comparison of the envelope signal generated by detector 20 as shown in FIG. 2B and the limited radio frequency signal generated by limiter 40 and shown in FIG. 2C, it is seen that every time the envelope signal exhibits an amplitude of zero (FIG. 2B), the limited radio frequency signal (FIG. 2C) exhibits a complete phase reversal. This is akin to square wave phase modulation which results in a signal of extremely side bandwidth being generated at the output of limiter 40. Substantial portions of these wideband components of the limited radio frequency signal generated at limiter 40 undesirably leak through modulator 60 to severely contaminate the amplified sideband signal at output 70 with substantial wide band splatter components as seen in FIG. 2D.

Such splatter components represent a serious problem. At low frequencies, for example in the range of 2–3 MHz where relatively large fixed transmitters are common, a filter after the amplifier circuit of FIG. 1 may be employed to attenuate some of this undesired splatter. However, at relatively high frequencies (136 MHz and above, for example) such filters would be so large as to be impractical for portable radio applications.

Accordingly, it is one object of the present invention to provide an amplifier which amplifies modulated radio frequency signals in a manner which generates an amplified signal with minimal splatter components.

Another object of the invention is to provide an amplifier which amplifies modulated radio frequency signals in a highly efficient manner.

Another object of the invention is to provide an amplifier for amplifying modulated radio frequency signals which avoids the deficiencies of the conventional approaches discussed above.

These and other objects of the invention will become apparent to those skilled in the art upon consideration of the following description of the invention.

BRIEF SUMMARY OF THE INVENTION

The present invention is directed to providing a radio frequency signal processing circuit for amplifying modulated radio frequency signals in a manner resulting in minimal splatter components.

In accordance with one embodiment of the invention, the processing circuit includes a first channel, having an input and an output, for processing modulated radio frequency signals provided thereto. The first channel includes an envelope signal generator (a.k.a. envelope signal detector) which is coupled to the input of the first channel for generating a rectified envelope signal from the modulated radio frequency signals provided thereto. The first channel further includes a peak clipping circuit, coupled to the envelope signal generating circuit, for clipping portions of the rectified envelope signal which exhibit an instantaneous voltage level, the absolute value of which is less than a first selected voltage level, $V_{T1}$, said peak clipping means otherwise allowing said rectified envelope signal to remain unclipped. The peak clipping circuit thus generates a clipped rectified envelope signal. The first channel further includes a first amplifying circuit, coupled to the output of the peak clipping circuit, for amplifying the clipped rectified envelope signal to generate a first channel output signal at the output of the first channel.

The radio frequency signal processing circuit includes a second channel, having an input coupled to the input of the first channel. The second channel processes modulated radio frquency signals provided thereto and includes a symmetric clipping circuit which is coupled to the input of the second channel. The symmetric clipping circuit symmetrically clips portions of the modulated radio frequency signals provided thereto which exhibit an instantaneous voltage level, the absolute value of which exceeds a second threshold voltage level, $V_{T2}$. The second threshold voltage level $V_{T2}$ is selected such that the symmetrical clipping circuit clips the modulated radio frequency signals in the second channel when the peak clipping circuit allows the rectified envelope signals in the first channel to remain unclipped. The second selected threshold voltage level $V_{T2}$ is further selected such that the symmetrical clipping circuit allows the modulated radio frequency signals in the second channel to remain unclipped when the peak clipping circuit clips the rectified envelope signal in the first channel. A symmetrically clipped signal having clipped and unclipped portions is thus generated by the symmetrical clipping circuit. The second channel further includes a second amplifier which is coupled to the symmetrical clipping circuit and is operatively coupled to the output of the first channel such that the first channel output signal modulates signals amplified by the second amplifier circuit. The second amplifier circuit is operative in a first mode for linearly amplifying the unclipped portions of the symmetrically clipped signal and is operative in a second mode for amplifying the clipped portions of the symmetrically clipped signal in a highly efficient saturated mode-type manner. An amplified radio frequency signal exhibiting minimal splatter components is thus generated in a highly efficient manner with minimal splatter components.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DETAILED DESCRIPTION OF THE PREFERRED EMBODIMENT

Figure 1:
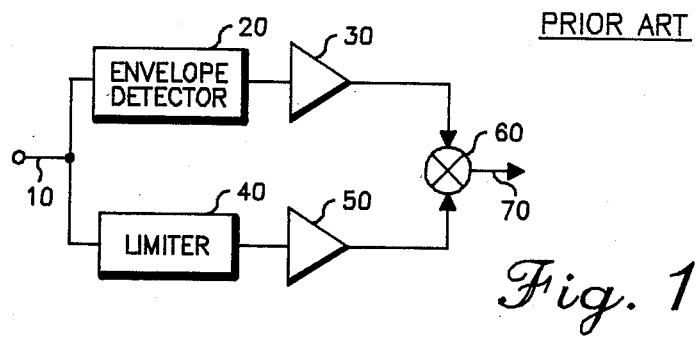
FIG. 1 is a block diagram of a conventional amplifier for modulated radio frequency signals.
Figure 2D:
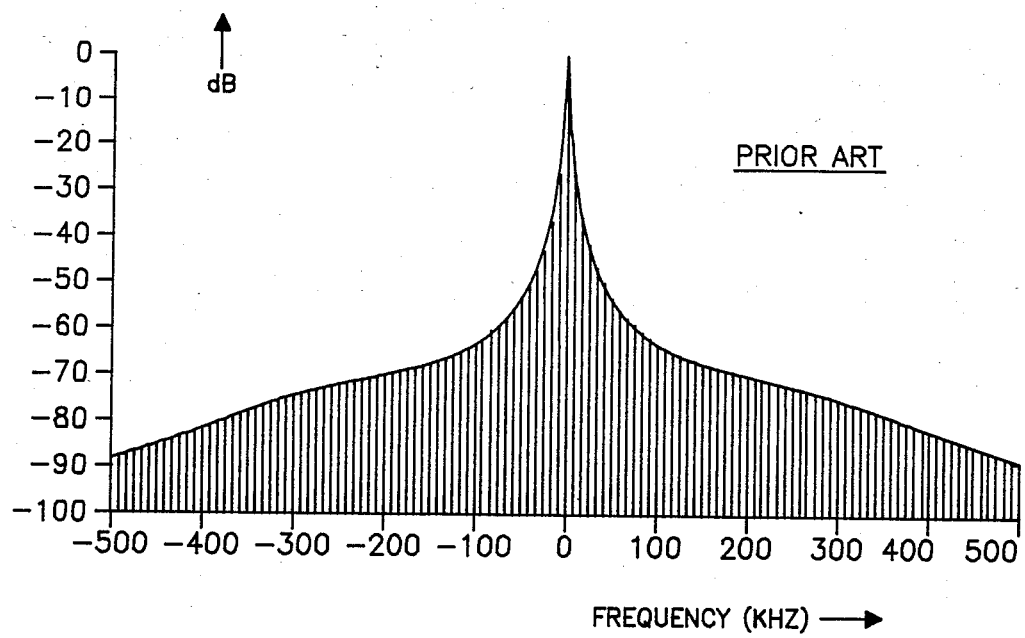
FIG. 2D is an amplitude (dB) versus frequency graph of the output signal of the circuit of FIG. 1. showing the frequency spectrum generated by such circuit.
Figure 2A:
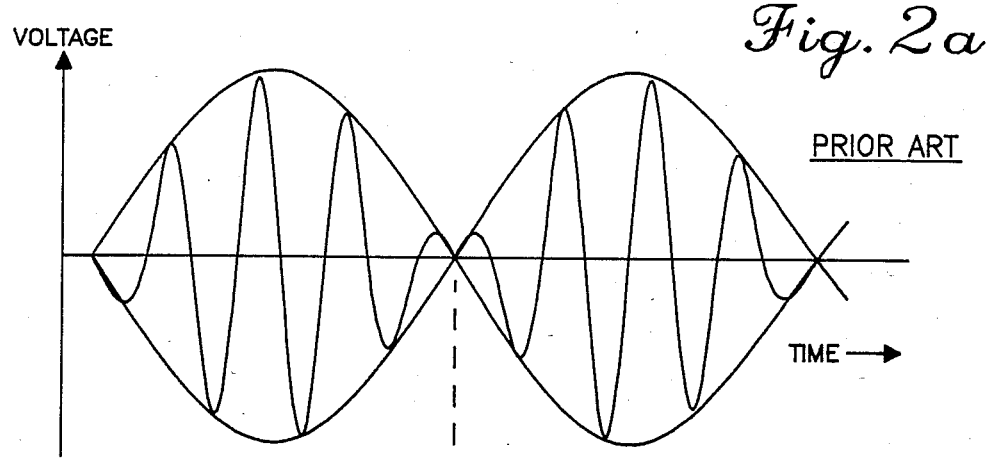
FIG. 2A is a representation of a standard two-tone sideband test signal.
Figure 2B:
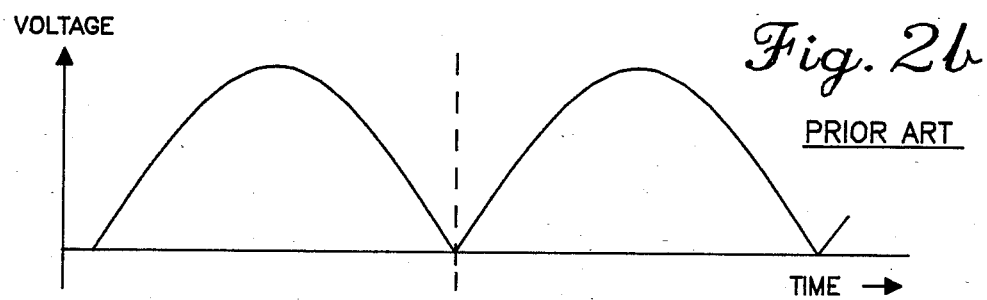
FIG. 2B is an amplitude (voltage) versus time graph of an envelope signal generated in the circuit of FIG. 1.
Figure 2C:
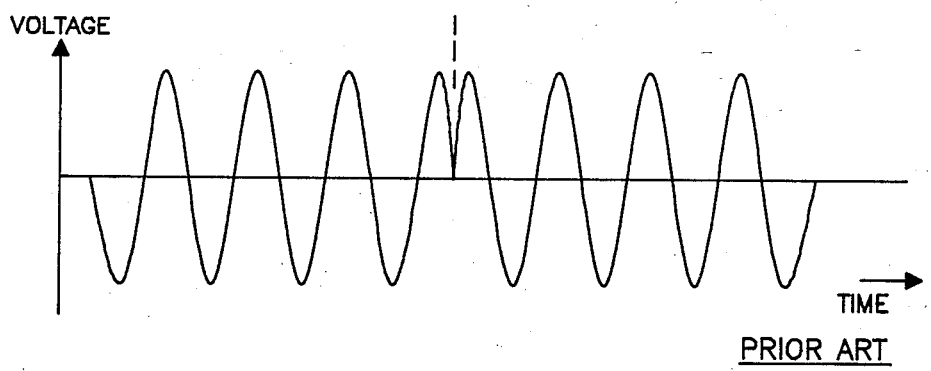
FIG. 2C is an amplitude (voltage) versus time graph of a limited radio frequency signal generated in the circuit of FIG. 1.
Figure 3:
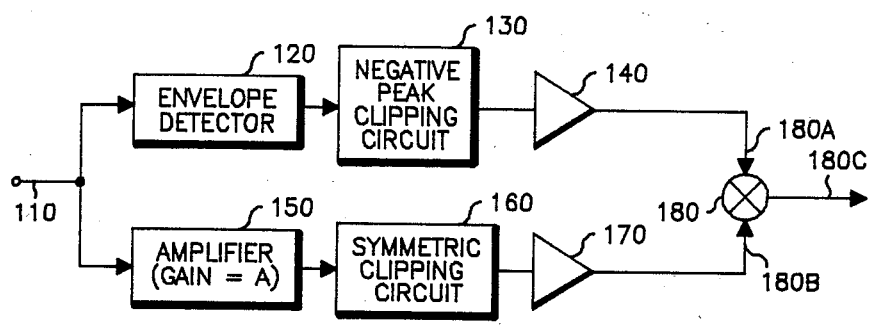
FIG. 3 is a block diagram of the signal processing circuit of the present invention.
Figure 4E:
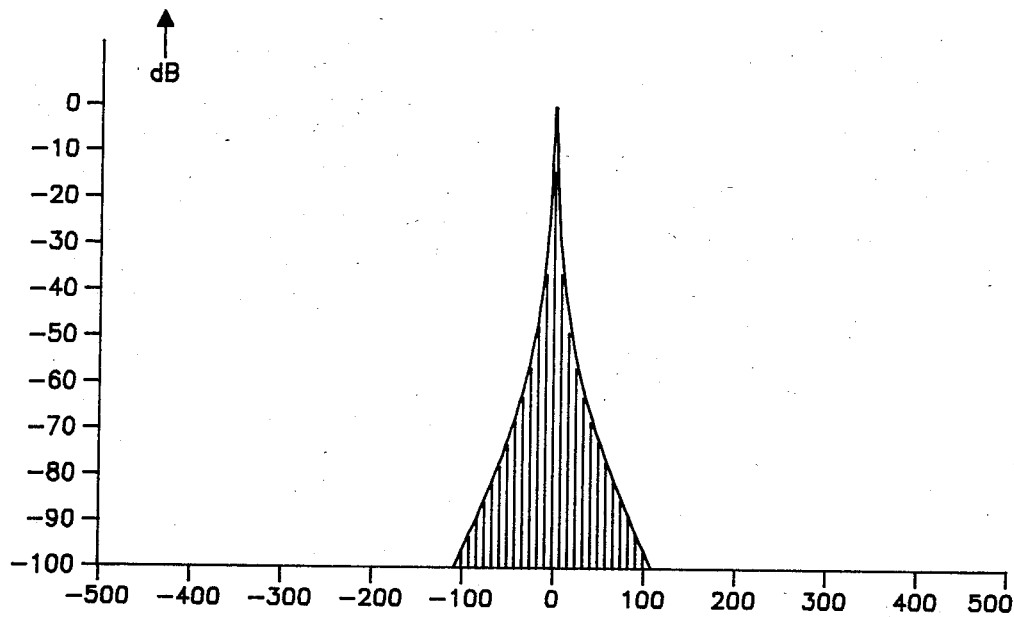
FIG. 4E is an amplitude (dB) versus frequency graph of the amplified modulated radio frequency signal generated at the output of the signal processing circuit of FIG. 3.
Figure 4A:
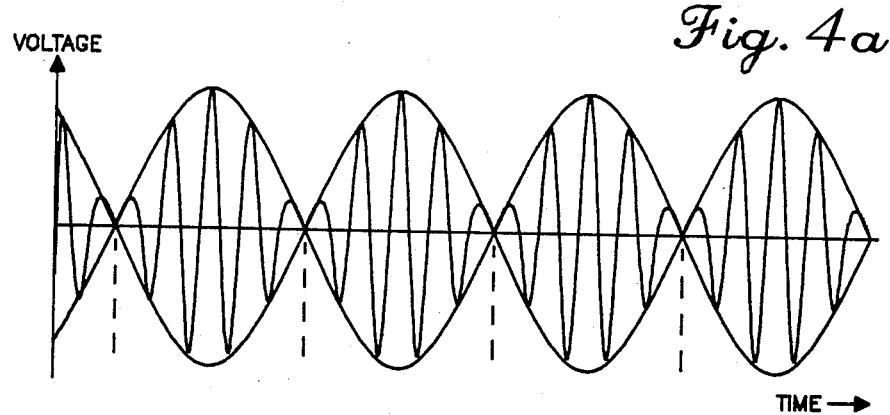
FIG. 4A is an amplitude (voltage) versus time graph of a standard two-tone single sideband test signal supplied to the input of the processing circuit invention shown in FIG. 3.
Figure 4B:
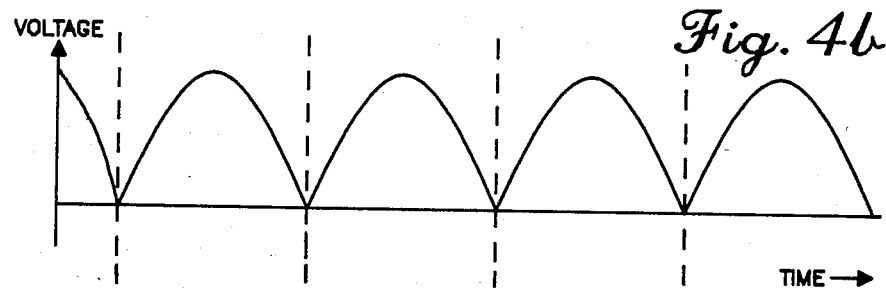
FIG. 4B is an amplitude (voltage) versus time graph of an envelope signal generated in the processing circuit of FIG. 3.

FIG. 3 illustrates one embodiment of the signal processing circuit of the present invention. The processing circuit of FIG. 3 includes an input 110 to which a standard two-tone (2 kHz, 4 kHz) single sideband signal such as that shown in FIG. 4A may be supplied for testing and comparison purposes. The standard two-tone test signal is known and accepted in the art as an appropriate test signal for single sideband amplification purposes. Input 110 is coupled to the input of an envelope detector 120 such that the signal of FIG. 4A or other modulated signals are provided thereto. Envelope detector 120, for example a diode or other rectification apparatus coupled to a low pass filter, generates a signal representing the rectified envelope of the modulated signal provided at the input of detector 120. The rectified envelope signal thus generated at the output of detector 120 is shown in FIG. 4B for the two-tone test signal input case. The output of envelope detector 120 is coupled to the input of a negative peak clipping circuit 130 which clips the portions of the rectified envelope signal which exhibit an instantaneous voltage level the absolute value of which is less than a predetermined threshold voltage level $V_{T1}$. Peak clipping circuit 130 otherwise permits the rectified envelope signal to pass through unclipped to the output thereof. Negative peak clipping circuit 130 thus generates a signal at its output which includes clipped and unclipped portions.

Figure 4C:
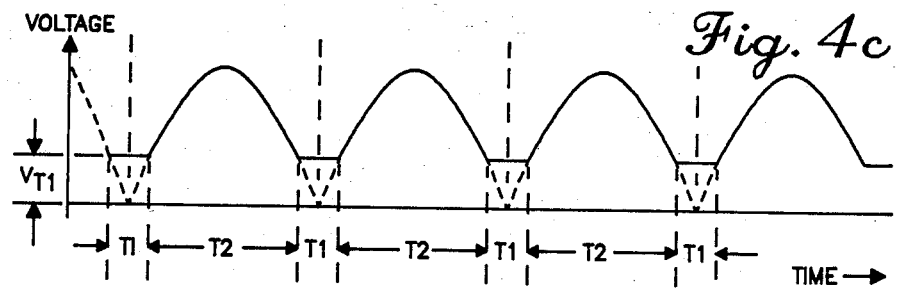
FIG. 4C is an amplitude (voltage) versus time graph of the envelope signal after negative peak clipping by the processing circuit of FIG. 3.

A clipped envelope signal such as that shown in FIG. 4C is thus generated at the output of negative peak clipping circuit 130 when the aforementioned two-tone test signal is provided to input 110. The times during which the absolute value of the rectified envelope signal falls below the $V_{T1}$ threshold so as to be clipped are referred to as T1 time intervals. In other words, the T1 time intervals correspond to the clipped portions of the rectified envelope signal. The times during which the absolute value of the rectified envelope signal is equal to or greater than the $V_{T1}$ threshold are referred to as T2 time intervals. In other words, the T2 time intervals correspond to the unclipped portions of the rectified envelope signal.

It is noted that the threshold level $V_{T1}$ is selected such that the durations of the clipped portions of the rectified envelope signal are substantially less than the durations of the unclipped portions thereof as shown in the two tone test signal case of FIG. 4C. It is desirable that $V_{T1}$ be selected such that peak clipping circuit 130 is operating more often in a non-clipping mode than a clipping mode for reasons subsequently described and explained. In the two tone test case of FIG. 4C, this results in the time intervals T1 being relatively short in duration as compared to the time intervals T2.

The output of negative peak clipping circuit 130 is coupled to the input of an audio frequency amplifier 140. Thus, the clipped rectified envelope signal of FIG. 4C is provided to amplifier 140 and amplified to a sufficiently high level to achieve the high level modulation discussed subsequently. For purposes of discussion, envelope detector 120, negative peak clipping circuit 130 and amplifier 140 are later collectively referred to as the first channel.

Figure 4D:
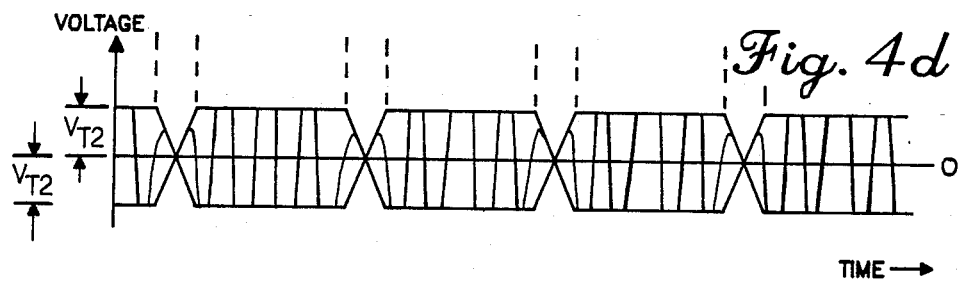
FIG. 4D is an amplitude versus time graph of the radio frequency signal waveform generated at the output of the radio frequency amplifier of the processing circuit of FIG. 3.

Processing circuit input 110 is coupled to the input of an amplifier 150 which exhibits a gain equal to a number represented by A. Amplifier 150, in conjunction with symmetric clipping circuit 160 and amplifier 170 (both discussed subsequently) are later collectively referred to as the second channel. In one embodiment of the invention, a gain of A approximately equal to 8 is employed for amplifier 150. In other embodiments of the invention, A is within the range of approximately 2 through approximately 40 although A is not limited to such values. The output of amplifier 150 is coupled to the input of a symmetric clipping circuit 160 which clips both the positive and negative peaks of the amplified modulated signal provided thereto by amplifier 150. A clipped radio frequency signal such as that shown in FIG. 4D is thus generated at the output of symmetric clipping circuit 160. Symmetric clipping circuit 160 clips positive and negative peaks of the amplified modulated radio frequency signal provided thereto which exceed respective positive and negative predetermined threshold voltage levels. Expressed alternatively, symmetric clipping circuit 160 clips portions of the amplified modulated radio frequency signal the absolute value of which exceeds a predetermined threshold voltage, $V_{T2}$, as shown in FIG. 4D. More specifically, clipping of the modulated amplified radio frequency signal provided to circuit 160 commences at a voltage equal to 1/A times the peak envelope voltage of the modulated signal provided to clipping circuit 160. As seen by comparing FIG. 4C and FIG. 4D, the threshold voltage $V_{T2}$ at which symmetric clipping circuit 160 clips is selected such that clipping circuit 160 commences clipping at substantially the time when clipping circuit 130 ceases clipping and such that clipping circuit 160 ceases clipping at substantially the time when clipping circuit 130 commences clipping. In other words, threshold $V_{T2}$ is selected such that symmetrical clipping circuit 160 clips modulated radio frequency signals in the second channel at times when negative peak clipping circuit 130 allows the rectified envelope signal in the first channel to remain unclipped and such that symmetrical clipping circuit 160 allows modulated radio frequency signals in the second channel to remain unclipped at times when the negative peak clipping circuit 130 causes rectified envelope signals in the first channel to be clipped.

It is noted that in FIG. 4D, the aforementioned time intervals T1 and T2 are shown by dashed lines extending from FIG. 4C. In summary, during the T1 time intervals, the amplified modulated signal provided by clipping circuit 160 remains unclipped whereas during the T2 time intervals such amplified modulated radio frequency is symmetrically clipped at the aforementioned predetermined threshold level $V_{T2}$.

The output of symmetric clipping circuit 160 is coupled to the input of a radio frequency amplifier 170 which is capable of non-linear highly efficient operation such as class C operation, when driven at relatively high levels and is further capable of linear operation, for example class A and B operation, when driven at relatively low levels. Thus, when radio frequency amplifier 170 is driven by the symmetrically clipped signal of FIG. 4D, during the T1 time intervals at which time the voltage drive level to such amplifier 170 is relatively small, amplifier 170 operates in a linear mode. However, when amplifier 170 is driven at a relatively high level such as during the T2 time intervals during which clipping occurs as seen in FIG. 4D, radio frequency amplifier 170 operates in a highly efficient non-linear mode, such as class C, class D, switching mode or other similar high efficiency mode of amplification.

In other words, amplifier 170 operates in a linear mode to amplify the unclipped portions of the symmetrically clipped signal and operates in a highly efficient non-linear mode to amplify the clipped portions of the symmetrically clipped signal. It is thus seen that amplifier 170 alternately operates in the relatively inefficient linear mode and the highly efficient non-linear class C or other efficient mode. However, the time intervals T1 during which linear operation is permitted are substantially smaller than the T2 time intervals during which class C or other efficient mode amplification is permitted thus resulting in amplifier 170 operating in a highly operating in a highly efficient manner during a substantial majority of each cycle of the clipped radio frequency signal (FIG. 4D) provided thereto. A high level efficiently generated radio frequency signal is thus provided to the output of radio frequency amplifier 170.

The processing circuit of the present invention includes a modulator 180 having inputs 180A and 180B an an output 180C. The high level clipped envelope signal generated at the output of audio frequency amplifier 140 is coupled to modulator input 180A. The high level radio frequency signal generated at the output of radio frequency amplifier 170 is coupled to input 180B of modulator 180. Amplifiers 140 and 170 each exhibit sufficient gain with respect to each other such that when the clipped envelope signal from amplifier 140 and the clipped radio frequency signal from amplifier 170 are combined together in modulator 180, the clipped envelope signal modulates the clipped radio frequency signal to the extent desired.

A high level amplified modulated radio frequency signal substantially the same as the modulated radio frequency signal provided to input 110 but exhibiting a substantially increased amplitude is thus generated at modulator output 180C. Amplification of the low level modulated radio frequency signal provided to input 110 in this manner results in an amplified modulated radio frequency signal at 180C which exhibits a minimal amount of undesired splatter. As seen in the amplitude vs. frequency graph FIG. 4E which depicts the output signals generated at modulator output 180C, the splatter is minimized to such a great extent that at 35 kHz from the carrier frequenis 80 dB below the signal at the carrier frequency (here shown at a frequency equal to 0 kHz).

Those skilled in the art will appreciate that in an alternative embodiment of the invention, radio frequency amplifier 170 and modulator 180 are conveniently combined together as one amplifier to conserve components.

Figure 5:
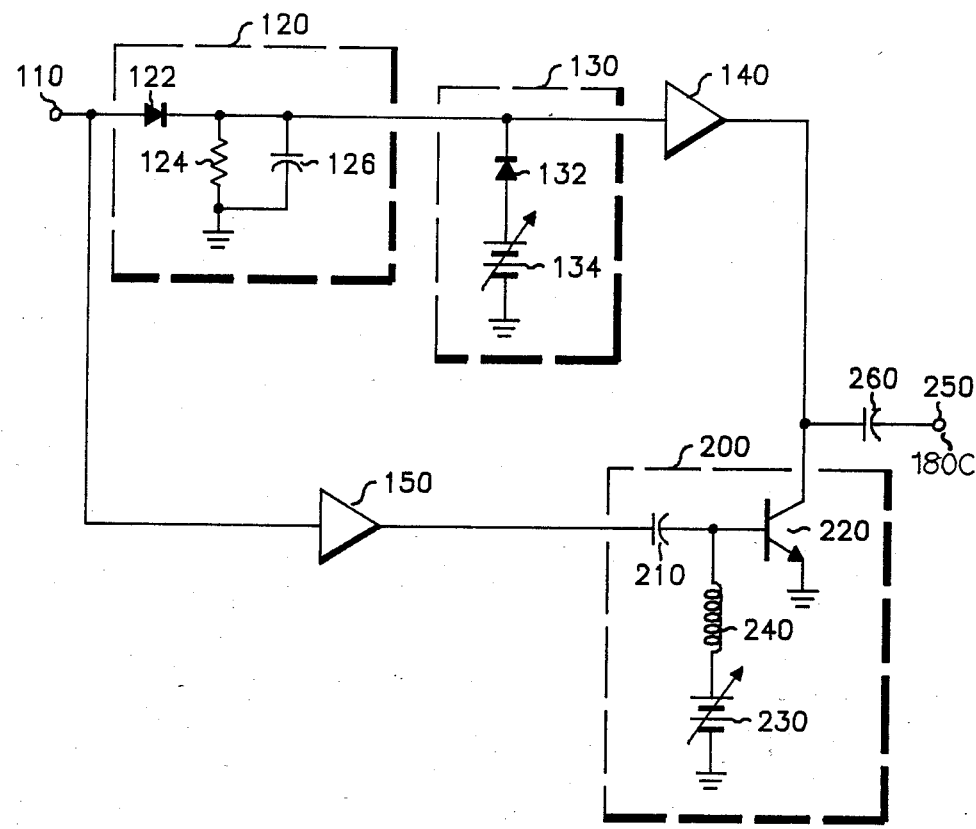
FIG. 5 is a circuit diagram of one embodiment of the present invention.

FIG. 5 shows one circuit implementation of the present invention which is substantially similar to the block diagram representation of FIG. 3 with like numbers indicating like structures. A low level modulated radio frequency signal to be amplified by the circuit of FIG. 5 is applied to input 110. Circuit input 110 is coupled to the anode of a diode 122 which rectifies the low level modulated radio frequency signal provided thereto to generate a rectified signal at the cathode thereof. The cathode of diode 122 is electrically coupled to one end of the parallel combination of a resistor 124 and a capacitor 126, the remaining end of such combination being electrically coupled to ground. The values of resistor 124 and capacitor 126 are selected such that this resistor-capacitor combination forms a low pass filter having a cut-off frequency selected to filter off the radio frequency components of the rectified signal provided thereto. In this manner, the radio frequency portions of the rectified signal are filtered, whereas the envelope of the rectified signal remains. Thus, diode 122 and resistor-capacitor combination 124, 126 cooperate to form an envelope detector 120 which accepts a low level modulated radio frequency signal at the input thereof and processes such signal to provide a rectified envelope signal at the output thereof.

The cathode of diode 122 which constitutes the output of envelope detector 120 is electrically coupled to the cathode of a diode 132. The anode of diode 132 is electrically coupled to the positive terminal of a DC (Direct Current) voltage source 134 which exhibits an adjustable or variable output voltage level. The negative terminal of variable voltage source 134 is coupled to ground. Diode 132 and variable voltage source 134 cooperate to form negative peak clipping circuit 130. By varying the output voltage of voltage source 134, the voltage at which diode 132 goes into conduction is likewise varied. Thus, the voltage threshold level $V_{T1}$ at which clipping circuit 130 clips the negative peaks of the rectified envelope signal provided thereto (see FIG. 4C) is adjustable. In actual practice, power supply 134 may be a fixed voltage value power supply generating an output voltage which causes clipping at the desired $V_{T1}$ threshold voltage level. Thus, a clipped rectified envelope signal is generated at the output of negative peak clipping circuit 130, namely the cathode of diode 132.

The output of negative peak clipping circuit 130 is coupled to the input of an audio frequency amplifier already described above in the discussion of FIG. 3. Audio frequency amplifier 140 amplifies the clipped rectified envelope signal provided thereto up to a sufficient level to cause modulation of radio frequency signals in the second channel, described subsequently. It is noted that envelope detector 120, negative peak clipping circuit 130 and amplifier 140 of FIG. 5 are designated as the first channel for purposes of discussion.

As shown in FIG. 5, processing circuit input 110 is coupled to the input of a radio frequency amplifier 150, the output of which is coupled to the input of a symmetric clipping amplifier 200. It is noted that symmetric clipping amplifier 200 of FIG. 5 conveniently combines the operations of symmetric clipping circuit 160, amplifier 170 and modulator 180 of FIG. 3 into a single symmetric clipping amplifier circuit 200. Amplifier 150 and symmetric clipping amplifier 200 cooperate to form a second channel. The output of amplifier 150 is coupled via a coupling capacitor 210 to the base of a radio frequency amplifier transistor 220, for example, Motorola Part No. 2N5590. The emitter of transistor 220 is coupled to ground. The collector of transistor 220 constitutes the output of the second channel and is electrically coupled to the output of the first channel, namely the output of amplifier 140. The base of transistor 220 is electrically coupled to the positive terminal of a variable direct current voltage source 230 via an inductor 240 coupled therebetween. The negative terminal of voltage source 230 is coupled to ground.

The operation of symmetric clipping amplifer 200 is now discussed. Since the collector of transistor 220 is coupled to the output of the first channel at amplifier 140, the amplified rectified envelope signal present at the output of the first channel modulates the radio frequency signals of the second channel which are amplified by transistor 220.

Adjusting the DC voltage level generated by power supply 230 varies the DC bias of the base of transistor 220. Varying the bias of transistor 220 in this manner varies the threshold level $V_{T2}$ at which radio frequency signals amplified by transistor 220 are symmetrically clipped. That is, amplifier transistor 220 clips the positive and negative piece of radio frequency signals provided thereto which exhibit an instantaneous voltage level the absolute value of which is greater than the controlled voltage level $V_{T2}$ determined by the bias selected for transistor 220. This clipping of the positive peaks of a radio frequency signal which exceed a voltage threshold level of $V_{T2}$ and clipping of the negative peaks of a radio frequency signal which exceed negative $V_{T2}$ in the negative direction is referred to as "symmetric clipping" and is illustrated in FIG. 4D. The amplified radio frequency output signal generated by the circuit of FIG. 5 is provided to output 250 via a coupling capacitor 260 coupled between circuit output 250 and the collector of transistor 220.

Those skilled in the ar will appreciate that the symmetric clipping performed by symmetric clipping amplifier 220 may, in other embodiments of the invention, be performed by other circuits in the second channel prior to circuit 200. For example, the symmetric clipping operation may be performed by appropriately biasing amplifier 150 in other embodiments of the invention. In such a case, those skilled in the art will appreciate that circuit 200 performs the remaining operations of amplification of the clipped radio frequency signal and modulation of such clipped signal with the audio output signal generated at the output of the first channel, namely amplifier 140.

Returning to the embodiment of the invention illustrated in FIG. 5, in summary, the $V_{T1}$ clipping threshold level, at which negative peak clipping circuit 130 of the first channel commences clipping, is set to optimize the trade-off between splatter generation and amplifier efficiency. It is noted that the higher $V_{T1}$ is set, the higher is the amount of splatter generated by the processing circuit of FIG. 5. This is so because with higher values of $V_{T1}$, the second channel is operating in a linear mode more often. However, when this is the case, the efficiency of the amplifier is commensurately lower. It is further noted that the lower $V_{T1}$ is set, the greater is the amount of splatter generated by the circuit of FIG. 5. This is so because for lower values of $V_{T1}$, the second channel is operating in a highly efficient mode, for example, class C, for greater durations of time. IT is found that by setting $V_{T1}$ at approximately 12% of the peak-to-peak voltage of the low level radio frequency modulated input signal provided to circuit input 110, an acceptable trade-off between splatter and efficiency is achieved. That is, for this value of $V_{T1}$, high amplifier efficiency is achieved while still maintaining relatively low levels of undesired splatter. Those skilled in the art will of course appreciate that other values of $V_{T1}$ may be employed depending upon the splatter levels and efficiency levels acceptable in a particular application of the invention.

It is noted that the value selected for $V_{T1}$ for the negative peak clipping circuit 130 of the first channel affects the amount of time during which the second channel spends operating in a first linear amplification mode as opposed to a highly efficient second amplification mode such as class C operation. This occurs because the $V_{T2}$ clipping threshold level is selected such that symmetric clipping in symmetric clipping amplifier 200 of the second channel commences when the rectified envelope signal of the first channel rises above the $V_{T1}$ first channel clipping threshold voltage. The $V_{T2}$ clipping threshold voltage of the second channel is further selected such that clipping in the second channel ceases when clipping in the first channel commences, that is when the rectified envelope signal in the first channel falls below the $V_{T1}$ first channel clipping threshold voltage. Simply speaking, $V_{T2}$ is selected such that the second channel is operating linearly (that is, not clipping) when the first channel is clipping and such that the second channel is clipping so as to operate in an efficient mode such as class C at times when the first channel is not clipping. The amount of time during which the second channel operates in a linear or non-linear mode thus directly depends on the clipping threshold level $V_{T1}$ selected for clipping circuit 130 of the first channel.

The foregoing describes a radio frequency signal processing circuit in which a low level modulated radio frequency signal is amplified to a high level in a very efficient manner which simultaneously minimizes undesired spurious splatter signal components.

While only certain preferred features of the invention have been shown by way of illustration, many modifications and changes will occur to those skilled in the art. For example, although in the particular embodiment of the invention discussed above wherein single sideband signals were efficiently amplified, those skilled in the art will appreciate that the circuit of the invention may be employed to efficiently amplify modulated radio frequency signals other than single sideband modulated signals. It is, therefore, to be understood that the present claims are intended to cover all such modifications and changes as fall within the true spirit of the invention.

What is claimed is:

1. A radio frequency signal processing circuit comprising:

first channel means, having an input and an output, for processing modulated radio frequency signals provided thereto including;

envelope signal generating means, coupled to the input of said first channel means, for generating a rectified envelope signal from said modulated signals;

peak clipping means, coupled to said envelope signal generating means, for clipping portions of said rectified envelope signal which exhibit an instantaneous voltage level the absolute value of which is less than a first selected voltage threshold level, $V_{T1}$, said peak clipping means otherwise allowing said rectified envelope signal to remain unclipped, thus generating a clipped rectified envelope signal;

first amplifying means, coupled to the output of said peak clipping means, for amplifying said clipped rectified envelope signal to generate a first channel output signal at the output of said first channel means;

second channel means, having an input coupled to the input of said first channel means, for processing modulated radio frequency signals provided thereto including;

symmetrical clipping means, coupled to the input of said second channel means, for symmetrically clipping portions of said modulated radio frequency signals which exhibit an instantaneous voltage level the absolute value of which exceeds a second threshold voltage level, $V_{T2}$, said second threshold voltage level, $V_{T2}$, being selected such that said symmetrical clipping means clips said modulated radio frequency signals in said second channel means when said peak clipping means allows said rectified envelope signals in said first channel means to remain unclipped and such that said symmetrical clipping means allows the modulated radio frequency signals in said second channel means to remain unclipped when said peak clipping means clips the rectified envelope signal in said first channel means, thus generating a symmetrically clipped signal having clipped and unclipped portions;

second amplifying means, coupled to said symmetrical clipping means and operatively coupled to the output of said first channel means such that the first channel output signal modulates signals amplified by said second amplifying means, said second amplifying means being operative in a first mode for linearly amplifying the unclipped portions of said symmetrically clipped signal and being operative in a second mode for amplifying the clipped portions of said symmetrically clipped signal in a highly efficient non-linear manner, whereby an amplified modulated radio frequency signal exhibiting minimal splatter components is generated.

2. The radio frequency signal processing circuit of claim 1 wherein said second amplifying means comprises a class C amplifier.

3. The radio frequency signal processing circuit of claim 1 wherein said second amplifying means comprises a class D amplifier.

4. The radio frequency signal processing circuit of claim 1 wherein said second amplifying means comprises a switching mode amplifier.

5. A radio frequency signal processing circuit comprising:

first channel means, having an input and an output, for processing modulated radio frequency signals provided thereto including;

envelope signal generating means, coupled to the input of said first channel means, for generating a rectified envelope signal from said modulated signals;

negative peak clipping means, coupled to said envelope signal generating means, for clipping portions of said rectified envelope signal which exhibit an instantaneous voltage level the absolute value of which is less than a first selected voltage threshold level, $V_{T1}$, said peak clipping means otherwise allowing said rectified envelope signal to remain unclipped, thus generating a clipped rectified envelope signal;

first amplifying means, coupled to the output of said peak clipping means, for amplifying said clipped rectified envelope signal to generate a first channel output signal at the output of said first channel means;

second channel means, having an input coupled to the input of said first channel means, for processing modulated radio frequency signals provided thereto including;

symmetrical clipping means, coupled to the input of said second channel means, for symmetrically clipping portions of said modulated radio frequency signals which exhibit an instantaneous voltage level the absolute value of which exceeds a second threshold voltage level, $V_{T2}$, said second threshold voltage level, $V_{T2}$, being selected such that said symmetrical clipping means clips said modulated radio frequency signals in said second channel means at times when said peak clipping means allows said rectified envelope signals in said first channel means to remain unclipped and such that said symmetrical clipping means allows the modulated radio frequency signals in said second channel means to remain unclipped at times when said peak clipping means clips the rectified envelope signal in said first channel means, thus generating a symmetrically clipped signal having clipped and unclipped portions;

second amplifying means, coupled to said symmetrical clipping means and operatively coupled to the output of said first channel means such that the first channel output signal modulates signals amplified by said second amplifying means, said second amplifying means being operative in a first mode for linearly amplifying the unclipped portions of said symmetrically clipped signal and being operative in a second mode for amplifying the clipped portions of said symmetrically clipped signal in a highly efficient non-linear manner, whereby an amplified modulated radio frequency signal exhibiting minimal splatter components is generated.

6. The radio frequency signal processing circuit of claim 5 wherein said second amplifying means comprises a class C amplifier.

7. The radio frequency signal processing circuit of claim 5 wherein said second amplifying means comprises a class D amplifier.

8. The radio frequency signal processing circuit of claim 5 wherein said second amplifying means comprises a switching mode amplifier.

9. A radio frequency signal processing circuit for processing a modulated radio frequency signal including positive and negative peaks provided thereto comprising:

envelope signal generating means, responsive to said modulated radio frequency signal, for generating a rectified envelope signal of said modulated radio frequency signal;

peak clipping means, coupled to said envelope signal generating means, for clipping portions of said rectified envelope signal which exhibit an instantaneous voltage level the absolute value of which is less than a first selected voltage threshold level $V_{T1}$, thus generating a clipped rectified envelope signal;

symmetric clipping means, responsive to said modulated radio frequency signal, for symmetrically clipping the positive and negative peaks of said modulated radio frequency signal when the absolute value of the instantaneous voltage of the positive and negative peaks of said modulated radio frequency signal exceeds a second selected threshold voltage level, $V_{T2}$, said second threshold voltage level being selected such that said symmetric clipping means commences clipping said modulated radio frequency signal when said peak clipping means ceases clipping said rectified envelope signal and such that said symmetric clipping means ceases clipping said modulated radio frequency signal when said peak clipping means commences clipping said rectified envelope signal, thus generating a symmetrically clipped signal including clipped and unclipped portions;

first amplifying means, operatively coupled to said symmetric clipping means, for amplifying said symmetrically clipped signal, said first amplifying means being operative in a first mode to linearly amplify the unclipped portions of said symmetrically clipped signal, said first amplifying means being operative in a second mode to amplify the clipped portions of said symmetrically clipped signal in a highly efficient non-linear manner, thus generating an amplified clipped signal, and modulating means operatively coupled to said peak clipping means and said amplifying means, for modulating said amplified clipped signal with said clipped rectified envelope signal to generate an amplified modulated radio frequency signal exhibiting minimal splatter components.

10. The radio frequency signal processing circuit of claim 9 including second amplifying means, coupled between said peak clipping means and said modulating means, for amplifying said clipped rectified envelope signal.

11. The radio frequency signal processing circuit of claim 9 wherein said amplifying means comprises a class C amplifier.

12. The radio frequency signal processing circuit of claim 9 wherein said amplifying means comprises a class D amplifier.

13. The radio frequency signal processing circuit of claim 9 wherein said amplifying means comprises a switching mode amplifier.

14. A radio frequency signal processing circuit comprising:

first channel means, having an input and an output, for processing modulated radio frequency signals provided thereto including;

envelope signal generating means, coupled to the input of said first channel means, for generating a rectified envelope signal from said modulated signals;

peak clipping means, coupled to said envelope signal generating means, for clipping portions of said rectified envelope signal which exhibit an instantaneous voltage level the absolute value of which is less than a first selected voltage threshold level, $V_{T1}$, said peak clipping means otherwise allowing said rectified envelope signal to remain unclipped, thus generating a clipped rectified envelope signal;

amplifying means, coupled to the output of said peak clipping means, for amplifying said clipped rectified envelope signal to generate a first channel output signal at the output of said first channel means;

second channel means, having an input and an output coupled to the input and output of said first channel means, respectively, for processing modulated radio frequency signals provided thereto including;

symmetric clipping amplifier means, coupled to the input of said second channel means for clipping and amplifying said modulated radio frequency signals, said symmetric clipping amplifier means clipping portions of said modulated radio frequency signal which exhibit an instantaneous voltage level the absolute value of which exceeds a second threshold voltage level $V_{T2}$, said second threshold voltage level, $V_{T2}$, being selected such that said symmetrical clipping amplifier means clips said modulated radio frequency signals in said second channel means at times when said peak clipping means allows said rectified envelope signals in said first channel means to remain unclipped and such that said symmetrical clipping amplifier means allows the modulated radio frequency signals in said second channel means to remain unclipped at times when said peak clipping means clips the rectified envelope signal in said first channel means, said symmetric clipping amplifier means being operatively coupled to the output of said first channel means such that the first channel output signal modulates signals processed by said symmetric clipping amplifier means, said symmetric clipping amplifier being operative in a first mode to linearly amplify signals provided thereto which exhibit instantaneous voltage levels the absolute value of which is less than $V_{T2}$, said symmetric clipping amplifier being operative in a second mode to amplify signals provided thereto in a highly efficient non-linear manner when such provided signals exhibit instantaneous voltage levels the absolute value of which is equal to or greater than $V_{T2}$, whereby an amplified modulated radio frequency signal is generated exhibiting minimal splatter components.

15. The radio frequency processing signal circuit of claim 14 wherein said symmetric clipping amplifier means is operative in a second mode which is class C amplification.

16. The radio frequency processing signal circuit of claim 14 wherein said symmetric clipping amplifier means is operative in a second mode which is class D amplification.

17. The radio frequency processing signal circuit of claim 14 wherein said symmetric clipping amplifier means is operative in a second mode which is switching mode amplification.

18. A radio frequency signal processing circuit comprising:

first channel means, having an input and an output, for processing modulated radio frequency signals provided thereto including;

envelope signal generating means, coupled to the input of said first channel means, for generating a rectified envelope signal from said modulated signals;

peak clipping means, coupled to said envelope signal generating means, for clipping portions of said rectified envelope signal which exhibit an instantaneous voltage level the absolute value of which is less than a first selected voltage threshold level, $V_{T1}$, said peak clipping means otherwise allowing said rectified envelope signal to remain unclipped, thus generating a clipped rectified envelope signal;

amplifying means, coupled to the output of said peak clipping means, for amplifying said clipped rectified envelope signal to generate a first channel output signal at the output of said first channel means;

second channel means, having an input and an output coupled to the input and output of said first channel means, respectively, for processing modulated radio frequency signals provided thereto including;

symmetric clipping amplifier means, coupled to the input of said second channel means for clipping and amplifying said modulated radio frequency signals, said symmetric clipping amplifier means clipping portions of said modulated radio frequency which exhibit an instantaneous voltage level the absolute value of which exceeds a second threshold voltage level $V_{T2}$, said second threshold voltage level, $V_{T2}$, being selected such that said symmetrical clipping amplifier means clips said modulated radio frequency signals in said second channel means at times when said peak clipping means allows said rectified envelope signals in said first channel means to remain unclipped and such that said symmetrical clipping amplifier means allows the modulated radio frequency signals in said second channel means to remain unclipped at times when said peak clipping means clips the rectified envelope signal in said first channel means, said symmetric clipping amplifier means being operatively coupled to the output of said first channel means such that the first channel output signal modulates signals processed by said symmetric clipping amplifier means, said symmetric clipping amplifier means being operative in a first mode to linearly amplify signals provided thereto at times when said symmetric clipping amplifier means is permitting signals provided thereto to remain unclipped, said symmetric clipping amplifier means being operative in a second mode to amplify signals provided thereto in a non-linear highly efficient manner at times when said symmetric clipping amplifier means is clipping signals provided thereto, whereby an amplified modulated radio frequency signal is generated.

19. The radio frequency signal processing circuit of claim 18 wherein said symmetric clipping amplifier means is operative in a second mode which is class C amplification.

20. The radio frequency signal processing circuit of claim 18 wherein said symmetric clipping amplifier means is operative in a second mode which is class D amplification.

21. The radio frequency signal processing circuit of claim 18 wherein said symmetric clipping amplifier means is operative in a second mode which is switching mode amplification.

* * * * *